(12) United States Patent
Izumida et al.

(10) Patent No.: US 8,035,199 B2
(45) Date of Patent: Oct. 11, 2011

(54) SEMICONDUCTOR DEVICE AND METHOD FOR MANUFACTURING THE SAME

(75) Inventors: Takashi Izumida, Yokohama (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 12/402,093

(22) Filed: Mar. 11, 2009

(65) Prior Publication Data

US 2009/0267155 A1 Oct. 29, 2009

(30) Foreign Application Priority Data

Apr. 24, 2008 (JP) ................. 2008-113813

(51) Int. Cl.
*H01L 29/06* (2006.01)

(52) U.S. Cl. ........ 257/623; 257/327; 257/347; 257/401; 257/618; 257/E21.77

(58) Field of Classification Search .......... 257/327, 257/347, 401, 618, 619, 623, E21.77
See application file for complete search history.

(56) References Cited

U.S. PATENT DOCUMENTS

| 5,315,143 | A | 5/1994 | Tsuji |
| 7,473,964 | B2 | 1/2009 | Izumida |
| 2005/0224800 | A1* | 10/2005 | Lindert et al. ................ 257/66 |
| 2007/0221956 | A1 | 9/2007 | Inaba |

FOREIGN PATENT DOCUMENTS

JP  2007-258485  10/2007

* cited by examiner

*Primary Examiner* — Tom Thomas
*Assistant Examiner* — Eduardo A Rodela
(74) *Attorney, Agent, or Firm* — Oblon, Spivak, McClelland, Maier & Neustadt, L.L.P.

(57) ABSTRACT

A semiconductor device has a semiconductor substrate, a semiconductor fin which is formed on the semiconductor substrate, which has a long side direction and a short side direction, and which has a carbon-containing silicon film including an impurity and a silicon film formed on the carbon-containing silicon film, a gate electrode which is formed to face both side surfaces of the semiconductor fin in the short side direction, source and drain regions which are respectively formed in the semiconductor fin located in the direction of both sides in the long side direction of the semiconductor fin so as to sandwich the gate electrode, and an element isolation insulating film which is formed on the side surface of the semiconductor fin and between the gate electrode and the semiconductor substrate.

16 Claims, 12 Drawing Sheets

SEMICONDUCTOR DEVICE AND METHOD FOR MANUFACTURING THE SAME

CROSS REFERENCE TO RELATED APPLICATION

This application is based upon and claims benefit of priority from the prior Japanese Patent Application No. 2008-113813, filed on Apr. 24, 2008, the entire contents of which are incorporated herein by reference.

BACKGROUND

A FinFET is configured by including: a projecting semiconductor layer (fin) which is formed on a surface portion of a semiconductor substrate and which has a long side direction and a short side direction; and gate electrodes formed on both side surfaces of the semiconductor layer in the short side direction via a gate insulating film. The semiconductor layer of the portion sandwiched by the gate electrodes serves as a channel region. Further, in the semiconductor layer, both sides of the channel region serve as the source and drain regions.

The FinFET can be roughly classified into a type using a bulk substrate, and a type using an SOI (Silicon On Insulator) substrate. The FinFET using the bulk substrate has an advantage that the manufacturing cost is low as compared with the type using the SOI substrate, and also has an advantage that there is no deterioration in transistor performance due to the body floating effect and the self-heating effect. On the other hand, in the FinFET using the bulk substrate, there is a problem that in the lower portion of the fin which portion is not sandwiched by the gate electrodes and which portion is hence a region hardly controlled by the gate electrode, the punch through is actually caused so as to thereby increase the off-leak current (to lower the capability of suppressing the short channel effect).

As a method for avoiding this problem, there is known a method in which a high concentration impurity layer (punch-through stopper) is formed in the lower portion of the fin (see, for example, Japanese Patent Laid-Open No. 2007-258485). However, there is a problem that the mobility of the channel region is lowered by the mixing of the impurity into the channel region at the time of formation of the punch-through stopper and by the diffusion of the punch-through stopper impurity into the channel region due to thermal diffusion.

SUMMARY OF THE INVENTION

According to one aspect of the present invention, there is provided a semiconductor device has a semiconductor substrate, a semiconductor fin which is formed on the semiconductor substrate, which has a long side direction and a short side direction, and which has a carbon-containing silicon film including an impurity and a silicon film formed on the carbon-containing silicon film, a gate electrode which is formed to face both side surfaces of the semiconductor fin in the short side direction, source and drain regions which are respectively formed in the semiconductor fin located in the direction of both sides in the long side direction of the semiconductor fin so as to sandwich the gate electrode, and an element isolation insulating film which is formed on the side surface of the semiconductor fin and between the gate electrode and the semiconductor substrate.

According to one aspect of the present invention, there is provided a semiconductor device manufacturing method has forming a fin having a long side direction and a short side direction by processing a first silicon film and a carbon-containing silicon film of a laminated body which has the first silicon film on the carbon-containing silicon film, forming an impurity contained in the carbon-containing silicon film, forming a gate electrode on both side surfaces of the fin in the short side direction via a gate insulating film, and forming source and drain regions in the fin located in the direction of both sides in the long side direction so as to sandwich the gate electrode.

DESCRIPTION OF THE EMBODIMENTS

In the following, semiconductor devices according to embodiments of the present invention will be described with reference to the accompanying drawings.

First Embodiment

Figure 1:
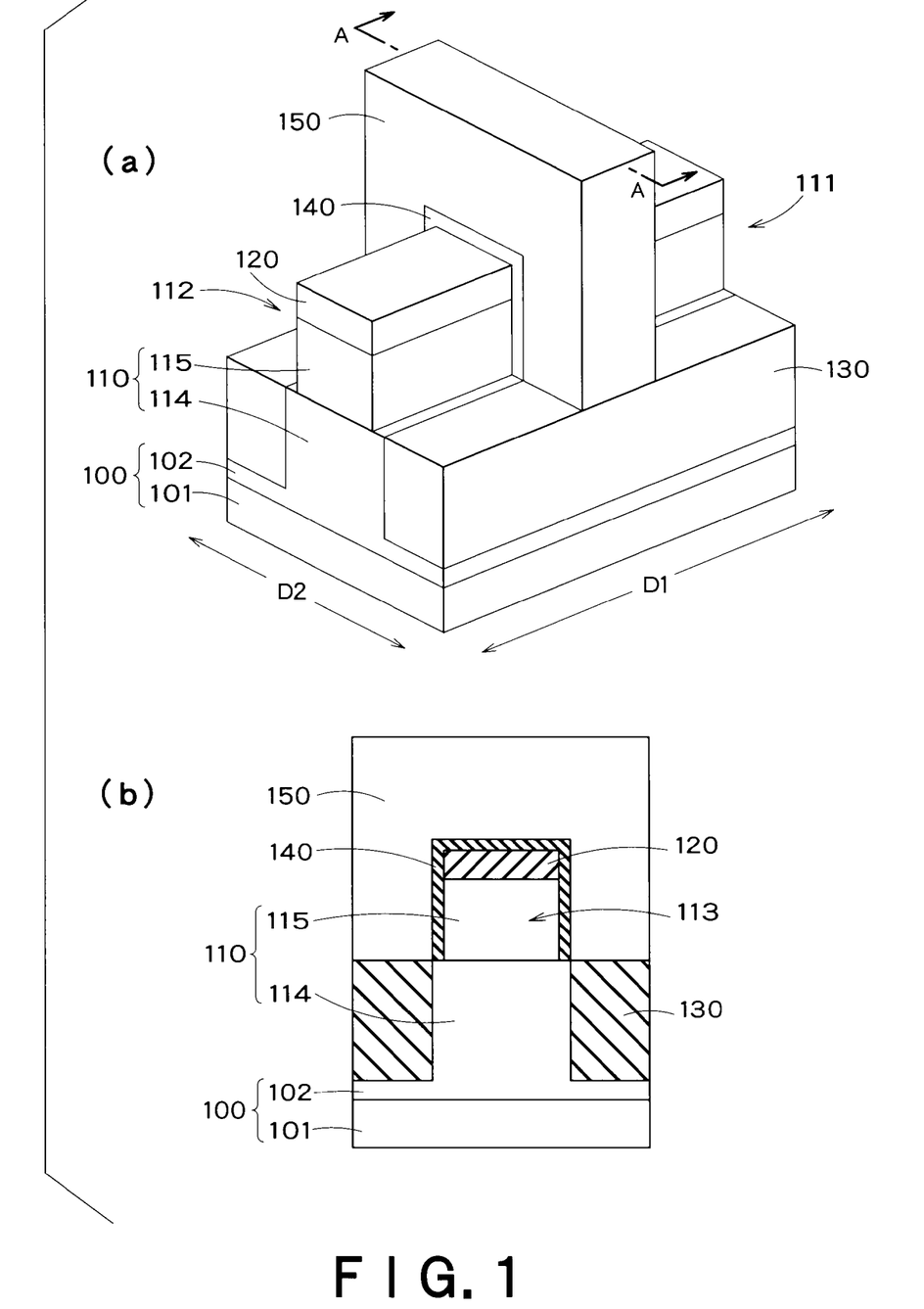
FIG. 1 is a schematic representation of a semiconductor device according to a first embodiment.

FIG. 1 shows a configuration of a semiconductor device (FinFET) according to a first embodiment of the present invention. FIG. 1(a) is a perspective view, and FIG. 1(b) is a longitudinal sectional view taken along the line A-A in FIG. 1(a).

The semiconductor device includes a semiconductor substrate 100, a fin 110, an insulating film 120, an element isolation insulating film 130, a gate insulating film 140, and a gate electrode 150. The semiconductor substrate 100 includes a silicon film 101 and a carbon-containing silicon film 102. The fin 110 is a semiconductor layer which is formed on the semiconductor substrate 100 and which has a long side direction (direction D1 in the figure) and a short side direction (direction D2 in the figure).

The gate electrode 150 is formed on the side surfaces of the fin 110 and the insulating film 120 in the short side direction (D2 direction) via the gate insulating film 140. Further, the gate electrode 150 is also formed on the insulating film 120.

In the fin 110, a source region 111 and a drain region 112 are formed in portions on both sides of the gate electrode 150. In the fin 110, a channel region 113 is formed in a portion between the source region 111 and the drain region 112, that is, in a portion on which the gate electrode 150 is formed via the gate insulating film 140.

The element isolation insulating film 130 is formed on the side surfaces of the fin 110 in the short side direction and between the gate electrode 150 and the semiconductor substrate 100.

The fin 110 includes a carbon-containing silicon film 114 and a silicon film 115. The carbon-containing silicon film 114 contains an impurity (for example, boron).

The carbon-containing silicon film 114 containing the impurity functions as a punch-through stopper which suppresses the punch through. Further, the carbon contained in the carbon-containing silicon film 114 traps interstitial silicon. Boron has a feature of being diffused together with the interstitial silicon, and the carbon suppresses the diffusion of the interstitial silicon by trapping the interstitial silicon. Thereby, the diffusion of boron is also suppressed. For this reason, the diffusion of boron into the channel region 113 is suppressed, and hence it is possible to prevent the increase in the impurity concentration in the channel. As a result, it is possible to prevent the reduction in channel mobility.

In this way, in the semiconductor device according to the present embodiment, there is formed the punch-through stopper capable of preventing the reduction in channel mobility.

A manufacturing method of the semiconductor device configured as described above will be described with reference to process sectional views shown in FIG. 2 and FIG. 3. The process sectional views are longitudinal sectional views taken along the line A-A in FIG. 1(a).

As shown in FIG. 2(a), a carbon-containing silicon film 201 is epitaxially grown on a silicon substrate 200. Then, a silicon film 202 is epitaxially grown on the carbon-containing silicon film 201.

As shown in FIG. 2(b), a silicon nitride film 203 is formed on the silicon film 202, and the silicon nitride film 203 is patterned by using a lithography process. Then, the silicon film 202 and the carbon-containing silicon film 201 are removed to a predetermined height by etching using the silicon nitride film 203 as a mask, so that a fin 204 is formed.

As shown in FIG. 2(c), a TEOS film is deposited so as to be filled in grooves in the side portions of the fin 204, and is flattened by a CMP (chemical mechanical polishing) method by using the silicon nitride film 203 as a stopper. Further, a RIE (reactive ion etching) process is performed so as to make the upper surface position of the TEOS film almost equal to the upper surface position of the carbon-containing silicon film 201, and thereby an element isolation insulating film (STI) 205 is formed.

As shown in FIG. 2(d), boron is injected perpendicularly to the upper surface of the element isolation insulating film 205. The boron is not only injected into the element isolation insulating film 205 but also injected into the carbon-containing silicon film 201 by a scattering phenomenon. Thereafter, activation annealing is performed, so that the punch-through stopper is formed.

Since the interstitial silicon is trapped by the carbon in the carbon-containing silicon film 201, the diffusion of the boron, which is injected into the carbon-containing silicon film 201, into the silicon film 202 is suppressed.

As shown in FIG. 3(a), a gate insulating film 206 is formed on the surface of the fin 204 by a thermal oxidation process. For example, a plasma oxidation process is used as the thermal oxidation process.

As shown in FIG. 3(b), a polysilicon film 207 is deposited, and is flattened by the CMP method by using the silicon nitride film 203 (thermally oxidized film 206 formed on the upper surface portion of the silicon nitride film 203) as a stopper.

As shown in FIG. 3(c), a polysilicon film 208 is formed on the polysilicon film 207 and the silicon nitride film 203. Then, a silicon nitride film (not shown) is formed on the polysilicon film 208, and a gate electrode is patterned by using a lithography process. The polysilicon films 207 and 208 are formed as the gate electrode.

Thereafter, an impurity is injected into the portions of the fin 204 which are located on both sides of the gate electrode (portions of the fin 204 which are not covered with the gate electrode), so that source and drain regions are formed. Further, in a post process, the silicon nitride film 203 on the source and drain regions can be removed.

In this way, the semiconductor device (FinFET) configured as shown in FIG. 1 is obtained.

The punch-through stopper according to the present embodiment is formed by the carbon-containing silicon film into which boron is injected, and the diffusion of boron into the channel region is suppressed by the carbon in the carbon-containing silicon film. Thereby, the punch-through stopper according to the present embodiment is not only able to function as a punch-through stopper, but also able to prevent the reduction in channel mobility.

Second Embodiment

Figure 4:
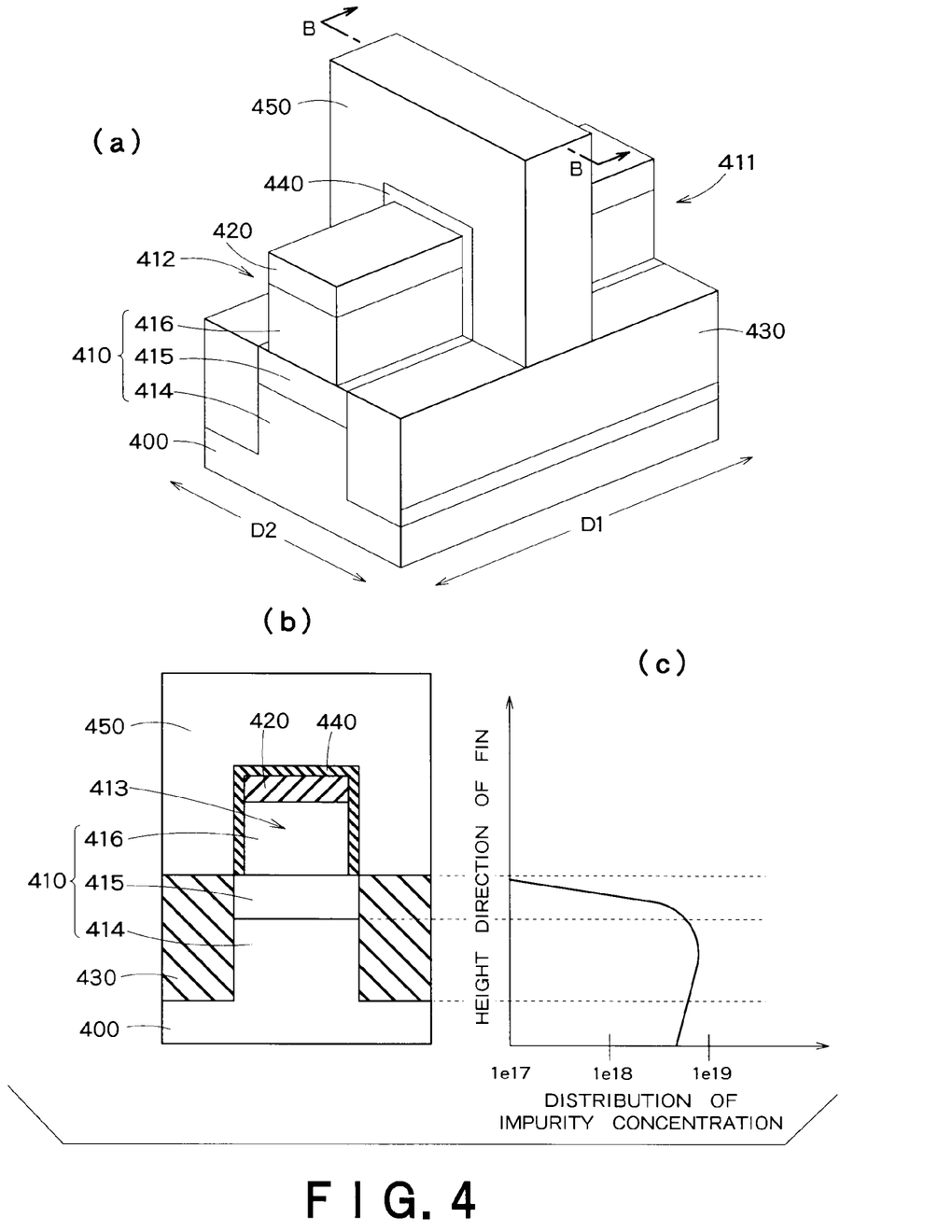
FIG. 4 is a schematic representation of a semiconductor device according to a second embodiment.

FIG. 4 shows a configuration of a semiconductor device (Fin FET) according to a second embodiment of the present invention. FIG. 4(a) is a perspective view, and FIG. 4(b) is a longitudinal sectional view taken along the line B-B in FIG. 4(a).

The semiconductor device includes a silicon substrate 400, a fin 410, an insulating film 420, an element isolation insulating film 430, a gate insulating film 440, and a gate electrode 450.

The fin 410 is a semiconductor layer which is formed on the silicon substrate 400 and which has a long side direction (direction D1 in the figure) and a short side direction (direction D2 in the figure).

The gate electrode 450 is formed on the side surfaces of the fin 410 and the insulating film 420 in the short side direction (D2 direction) via the gate insulating film 440. Further, the gate electrode 450 is also formed on the insulating film 420.

In the fin 410, a source region 411 and a drain region 412 are formed in portions on both sides of the gate electrode 450. In the fin 410, a channel region 413 is formed in a portion between the source region 411 and the drain region 412, that is, in a portion on which the gate electrode 450 is formed via the gate insulating film 440.

The element isolation insulating film 430 is formed on the side surfaces of the fin 410 in the short side (D2) direction and between the gate electrode 450 and the silicon substrate 400.

The fin 410 includes a silicon film 414, a carbon-containing silicon film 415, and a silicon film 416. The silicon film 414 and the carbon-containing silicon film 415 contain an impurity (for example, boron).

FIG. 4(c) shows the distribution of impurity concentration. As can be seen from this figure, the impurity concentration in the silicon film 414 is increased toward the upper portion of the silicon film 414, that is, toward the carbon-containing silicon film 415. On the other hand, the impurity concentration in the carbon-containing silicon film 415 is significantly reduced toward the upper portion of the carbon-containing silicon film 415, that is, toward the silicon film 416.

The silicon film 414 and the carbon-containing silicon film 415, which contain the impurity, function as a punch-through stopper for suppressing the punch through. The carbon contained in the carbon-containing silicon film 415 traps interstitial silicon. Boron has a feature of being diffused together with interstitial silicon, and the carbon suppresses the diffusion of the interstitial silicon by trapping the interstitial silicon. Thereby, the diffusion of boron is also suppressed. For this reason, the diffusion of boron into the channel region 413 is suppressed, and the increase in the impurity concentration in the channel is prevented. As a result, it is possible to prevent the reduction in channel mobility.

In this way, in the semiconductor device according to the present embodiment, there is formed the punch-through stopper capable of preventing the reduction in channel mobility.

A manufacturing method of the semiconductor device configured as described above will be described with reference to process sectional views shown in FIG. 5 and FIG. 6. The process sectional views are longitudinal sectional views taken along the line B-B in FIG. 4(*a*).

Figure 5:
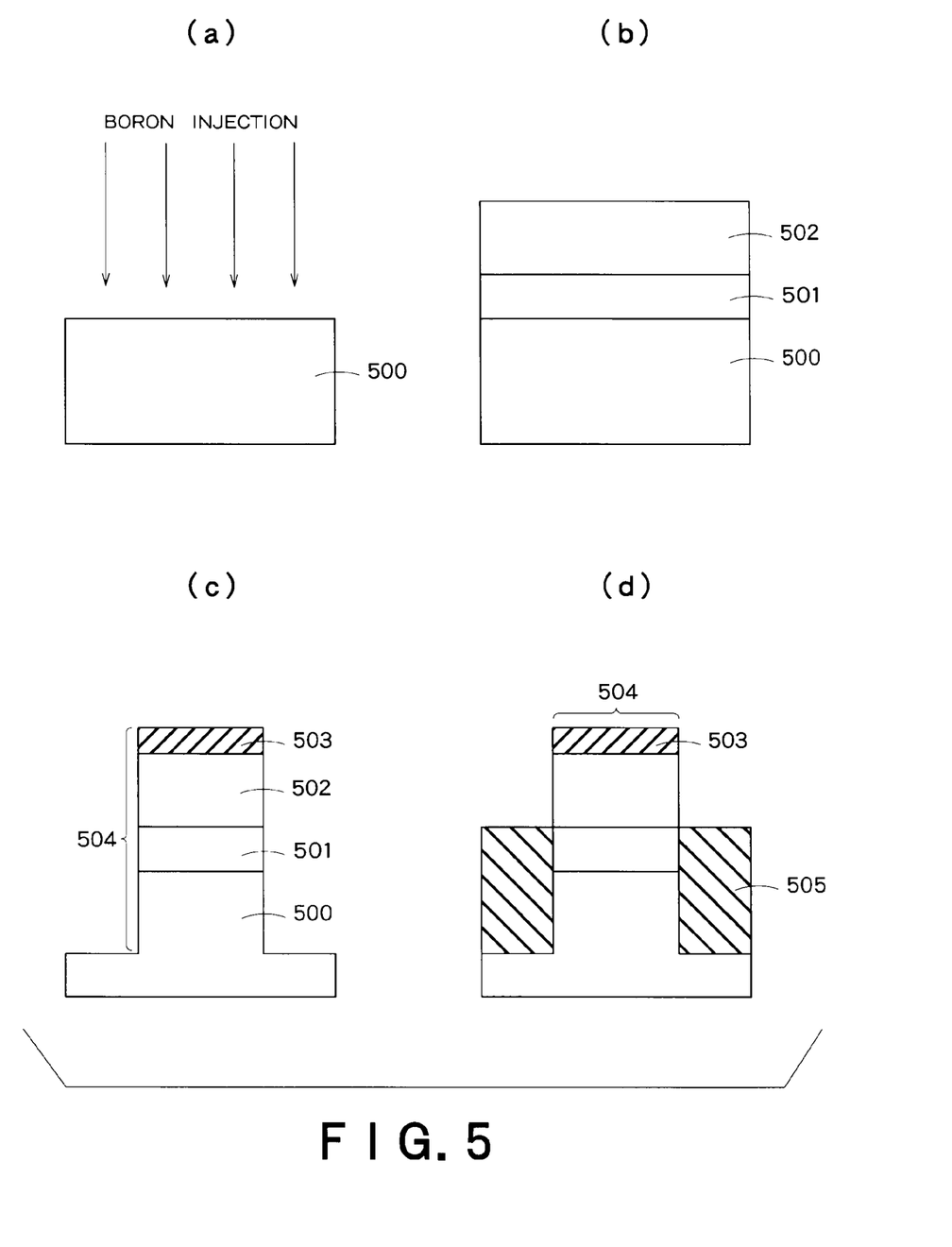
FIG. 5 and FIG. 6 are process sectional views for explaining a manufacturing method of the semiconductor device according to the second embodiment.

As shown in FIG. 5(*a*), boron is injected into the surface portion of a silicon substrate 500.

As shown in FIG. 5(*b*), a carbon-containing silicon film 501 is epitaxially grown on the silicon substrate 500 so as to have a film thickness of 10 nm. Then, a silicon film 502 is epitaxially grown on the carbon-containing silicon film 501.

When boron injected into the surface portion of the silicon substrate 500 is diffused to enter the carbon-containing silicon film 501, the diffusion of the boron is suppressed by the carbon in the carbon-containing silicon film 501. Thereby, the boron is prevented from entering the silicon film 502.

The diffusion of the boron is suppressed in this way, and hence the impurity concentration (boron concentration) in the carbon-containing silicon film 415 (carbon-containing silicon film 501) is distributed so as to be significantly reduced toward the silicon film 416 (silicon film 502) as shown in FIG. 4(*c*).

As shown in FIG. 5(*c*), a silicon nitride film 503 is formed on the silicon film 502, and the silicon nitride film 503 is patterned by using a lithography process. Then, the silicon film 502, the carbon-containing silicon film 501, and the silicon substrate 500 are removed to a predetermined height by etching using the silicon nitride film 503 as a mask, so that a fin 504 is formed.

As shown in FIG. 5(*d*), a TEOS film is deposited so as to be filled in grooves in the side portions of the fin 504, and is flattened by the CMP method by using the silicon nitride film 503 as a stopper. Further, a RIE (reactive ion etching) process is performed so as to make the upper surface position of the TEOS film almost equal to the upper surface position of the carbon-containing silicon film 501, and thereby an element isolation insulating film (STI) 505 is formed.

Figure 6:
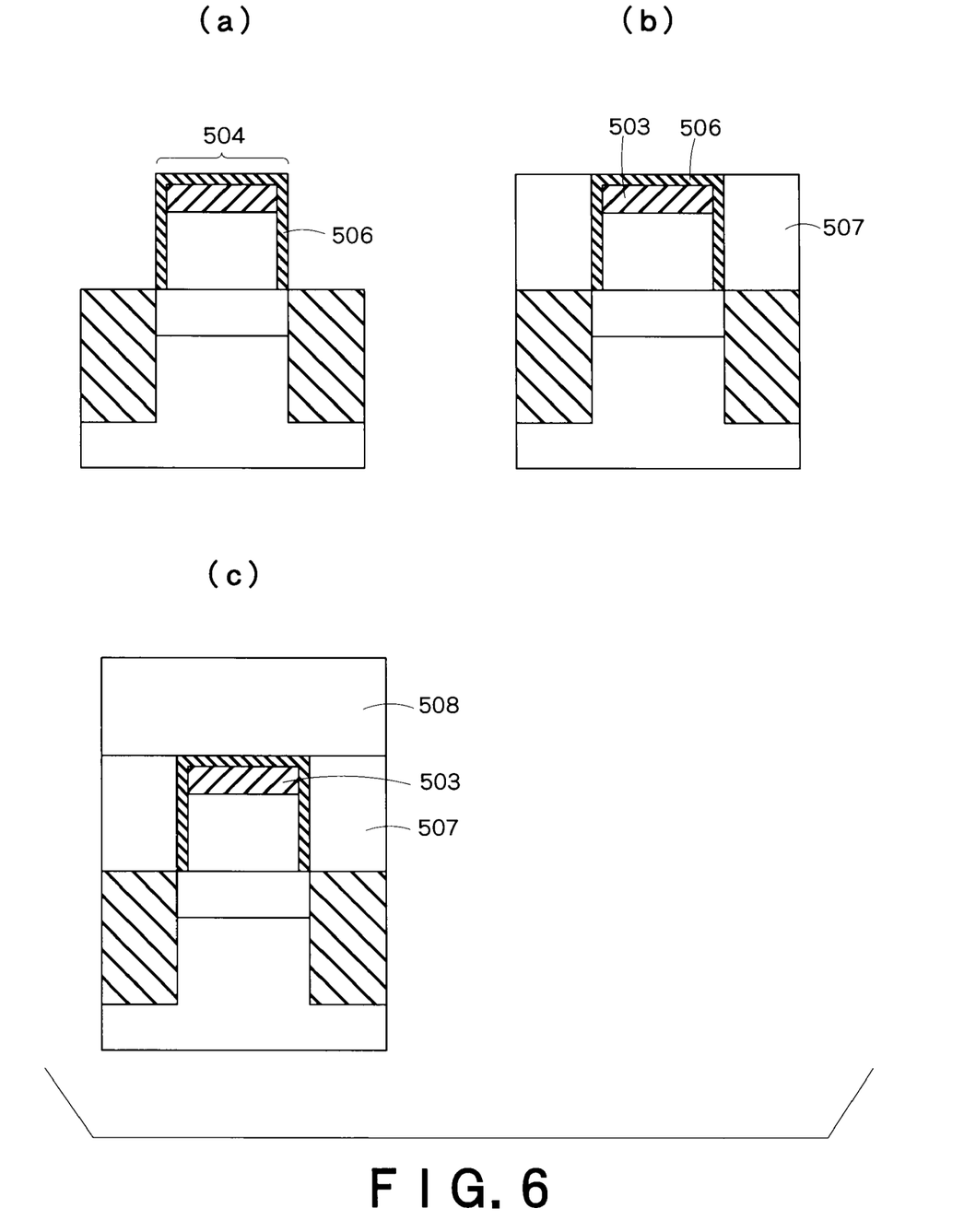

As shown in FIG. 6(*a*), a gate insulating film 506 is formed on the surface of the fin 504 by a thermal oxidation process. For example, a plasma oxidation process is used as the thermal oxidation process.

As shown in FIG. 6(*b*), a polysilicon film 507 is deposited, and is flattened by the CMP method by using the silicon nitride film 503 (thermally oxidized film 506 formed on the upper surface portion of the silicon nitride film 503) as a stopper.

As shown in FIG. 6(*c*), a polysilicon film 508 is formed on the polysilicon film 507 and the silicon nitride film 503. Then, a silicon nitride film (not shown) is formed on the polysilicon film 508, and a gate electrode is patterned by using a lithography process. The polysilicon films 507 and 508 are formed as the gate electrode.

Thereafter, an impurity is injected into the portions of the fin 504 which are located on both sides of the gate electrode (portions of the fin 504 which are not covered with the gate electrode), so that source and drain regions are formed. Further, in a post process, the silicon nitride film 503 on the source and drain regions can be removed.

In this way, the semiconductor device (FinFET) configured as shown in FIG. 4 is obtained.

As described above, under the channel region, there is formed the punch-through stopper made of the carbon-containing silicon film and the silicon film which contain boron, and thereby the off-leak current is reduced. Further, the carbon in the carbon-containing silicon film (415, 501) prevents boron from being diffused into the channel region, and prevents the increase in the impurity concentration in the channel. Thereby, the reduction in channel mobility can be suppressed.

Figure 2:
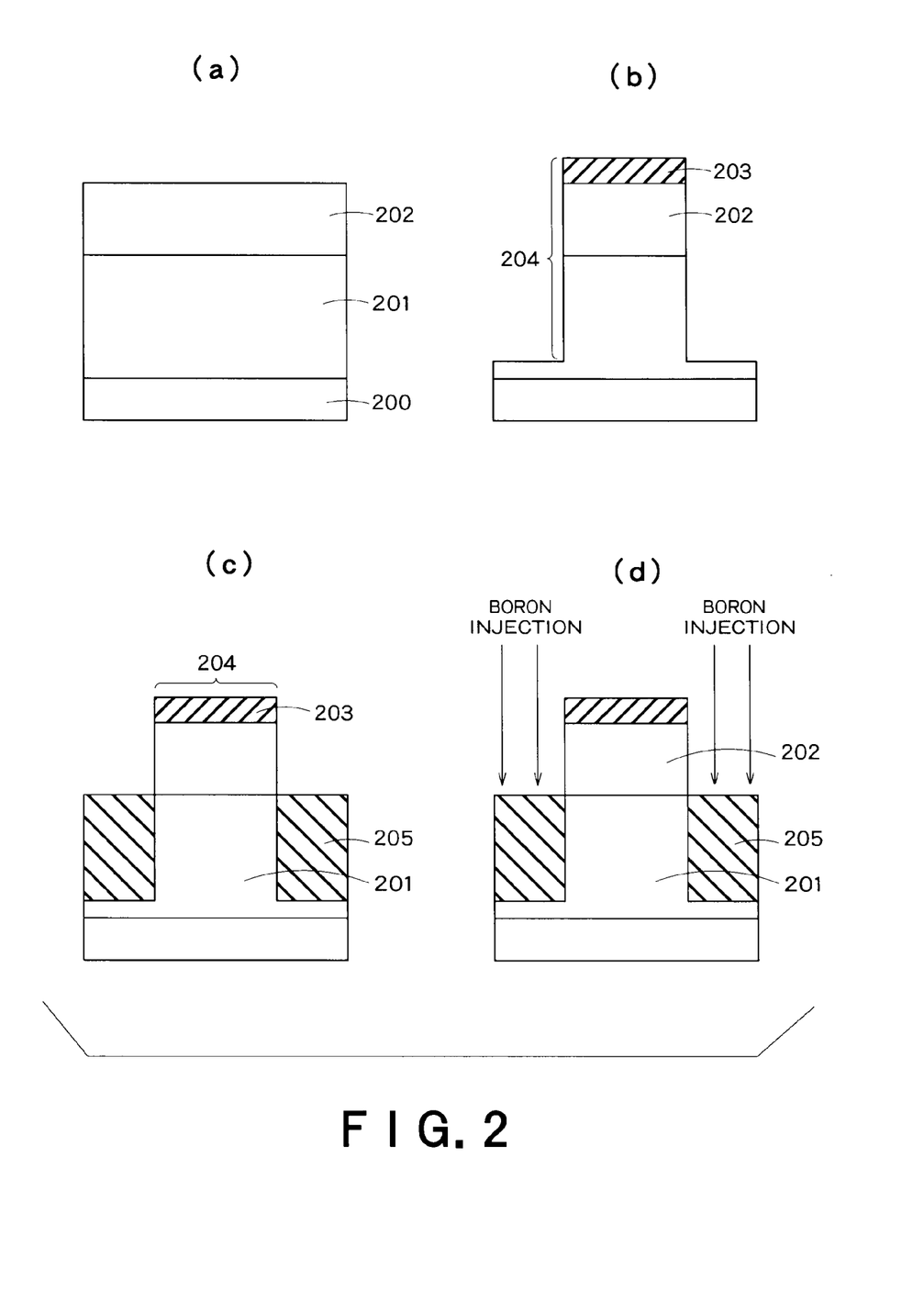
FIG. 2 and FIG. 3 are process sectional views for explaining a manufacturing method of the semiconductor device according to the first embodiment.
Figure 3:
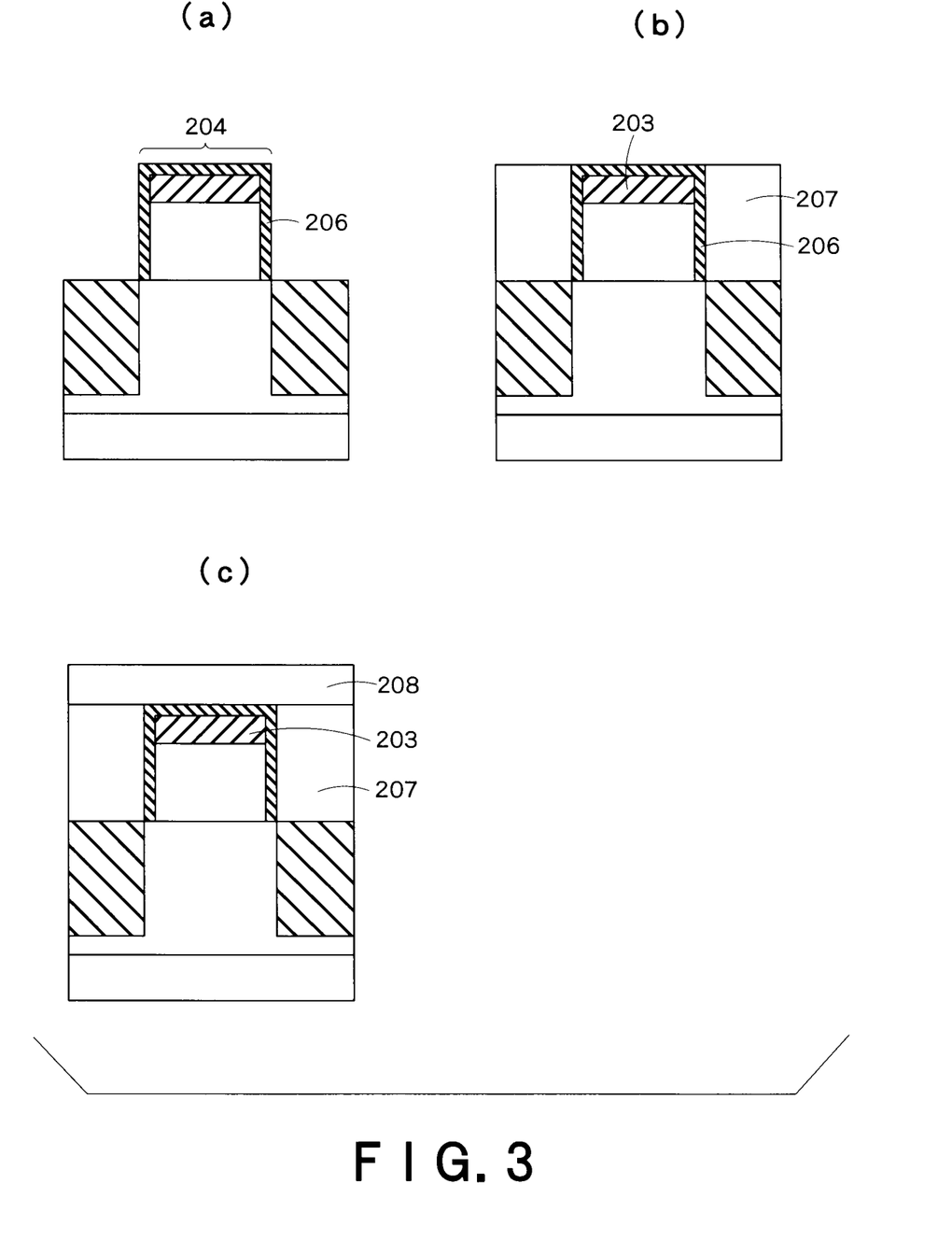

Further, in the process shown in FIG. 2(*d*) in the above described first embodiment, when boron is injected perpendicularly to the upper surface of the element isolation insulating film 205, the reflected and scattered boron is injected into the silicon film (channel region) 202. Thereby, the impurity concentration in the channel is increased, so as to thereby reduce the channel mobility. However, in the present embodiment, since boron is injected beforehand into the surface portion of the silicon substrate 500 as shown in FIG. 5(*a*), it is possible to effectively suppress the increase in the impurity concentration in the channel and the reduction in channel mobility.

Figure 7:
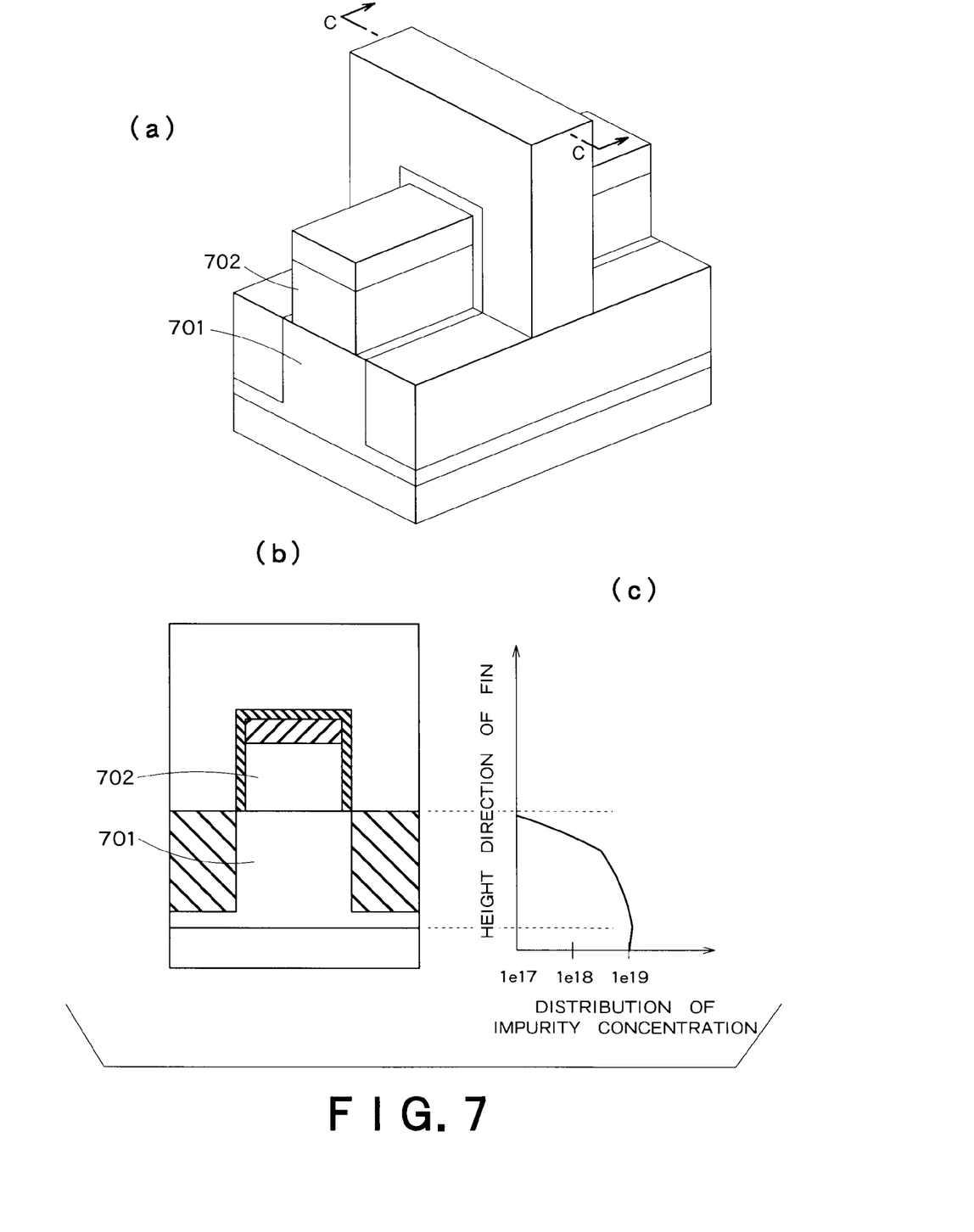
FIG. 7 to FIG. 12 are schematic representations of semiconductor devices according to modifications.

A preferred film thickness of the carbon-containing silicon film in the above described embodiments is changed by the carbon concentration. For example, in the above described second embodiment, when the carbon concentration of a formable carbon-containing silicon film is lower than the carbon concentration of the carbon-containing silicon film 415 shown in FIG. 4, it is necessary to increase the film thickness of the carbon-containing silicon film. FIG. 7 shows a schematic representation of a semiconductor device in such case. FIG. 7(*a*) is a perspective view, and FIG. 7(*b*) is a longitudinal sectional view taken along the line C-C in FIG. 7(*a*). FIG. 7(*c*) is a distribution diagram of boron concentration.

As can be seen from FIG. 7, when the carbon concentration in the carbon-containing silicon film 701 is low, the boron concentration under the silicon film 702 is gradually reduced toward the silicon film 702.

Further, in the above described first embodiment, when the carbon concentration in a formable carbon-containing silicon film is higher than the carbon concentration of the carbon-containing silicon film 114 shown in FIG. 1, it is possible to reduce the film thickness of the carbon-containing silicon film. In this case, the formed semiconductor device is configured as shown in FIG. 4(*a*).

Figure 8:
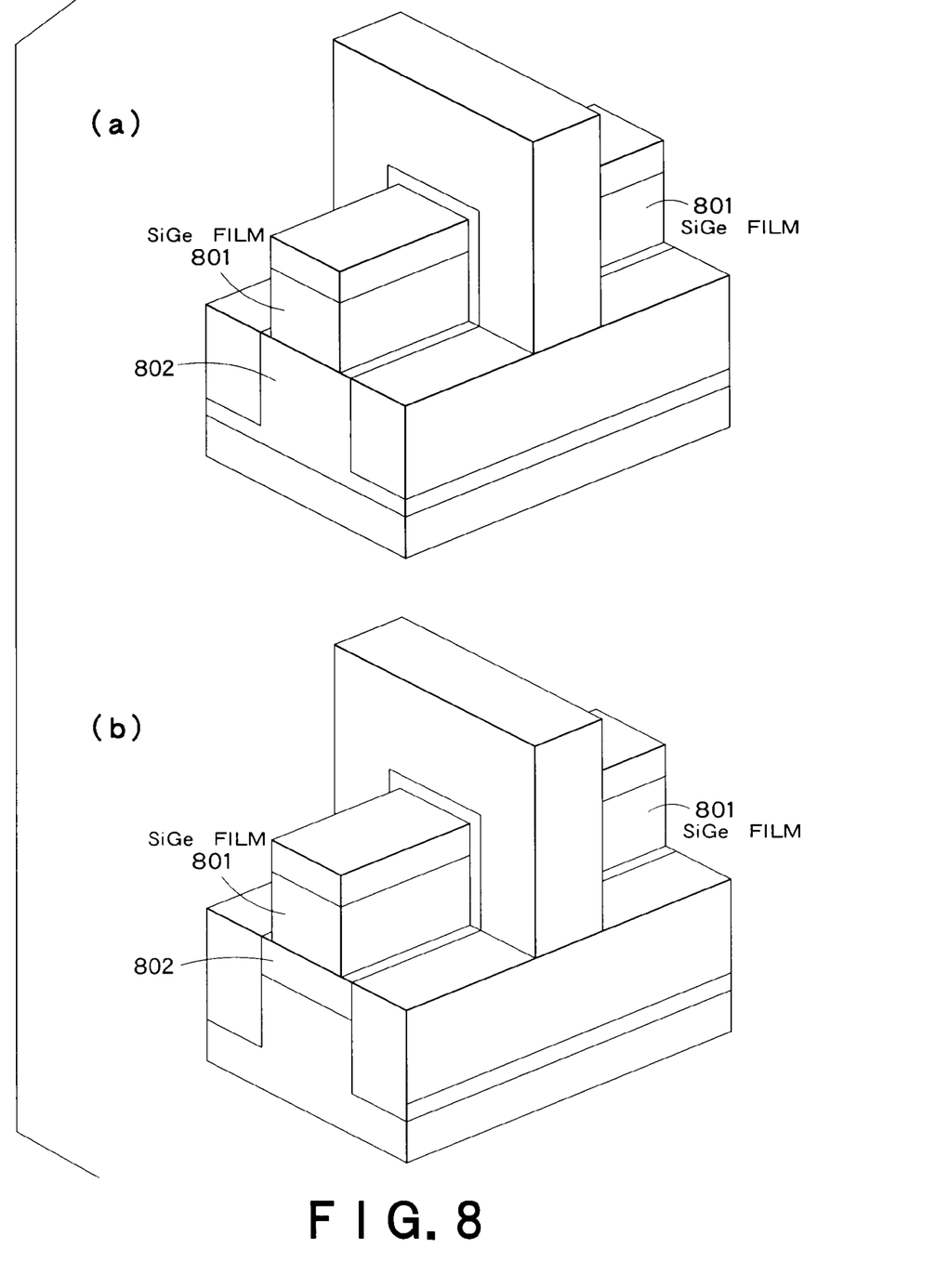

In the above described embodiments, the channel region and the source and drain regions (115, 416) are formed by a silicon film. However, as shown in FIG. 8, the channel region and the source and drain regions may also be formed by a SiGe film 801. FIG. 8(*a*) shows a semiconductor device in the case where the carbon concentration of a carbon-containing silicon film 802 under the SiGe film 801 is low. FIG. 8(*b*) shows a semiconductor device in the case where the carbon concentration of the carbon-containing silicon film 802 under the SiGe film 801 is high. It is possible to improve the channel mobility by forming the channel region with the SiGe film.

Figure 9:
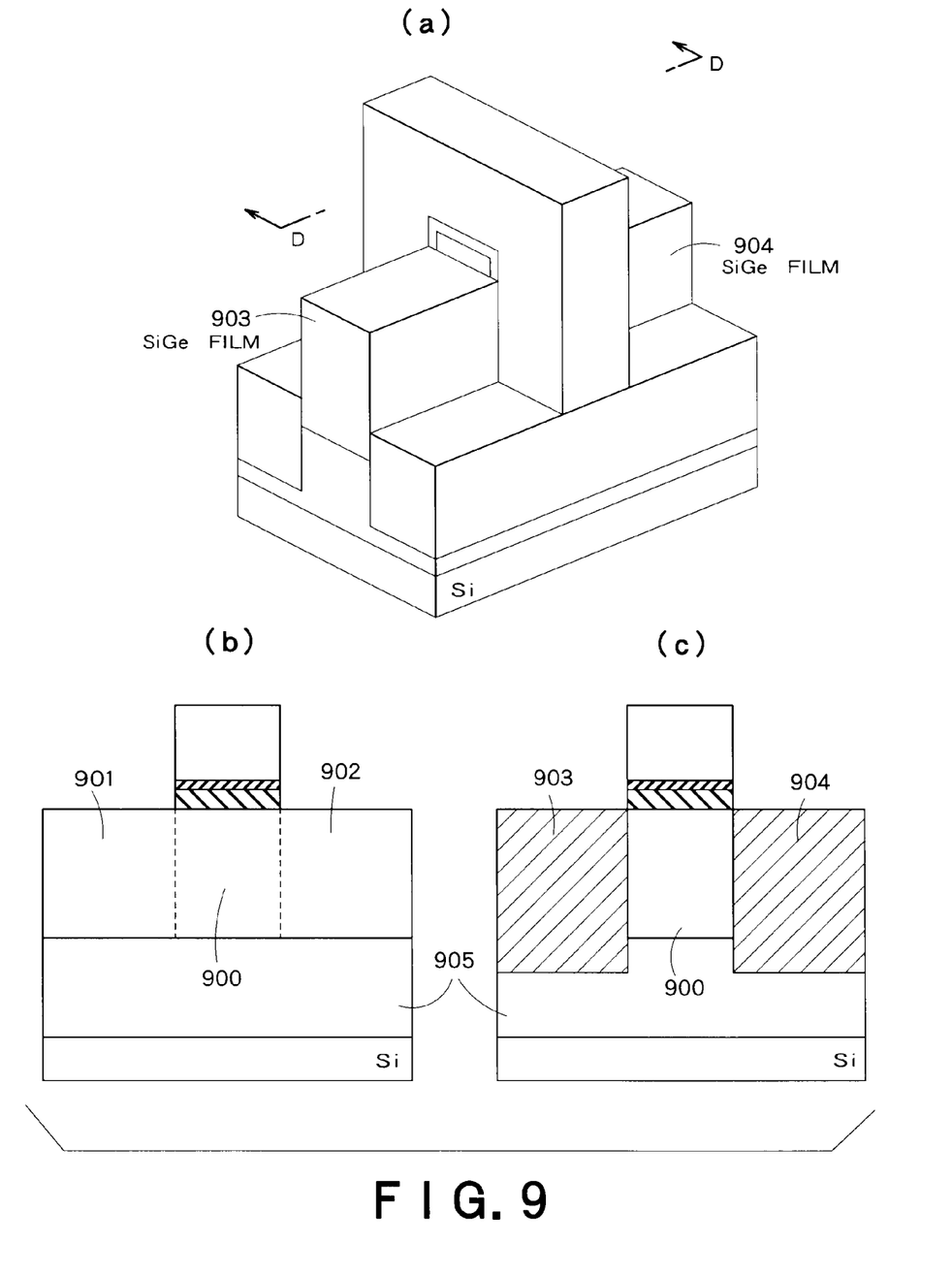

Further, as shown in FIG. 9, the channel mobility may also be improved in such a manner that the channel region of the fin is formed by a silicon film, and that the source and drain regions are formed by a SiGe film, and that a stress is applied to the channel region. FIG. 9(*a*) is a perspective view. FIG. 9(*b*) and FIG. 9(*c*) respectively show longitudinal sectional views taken along the line D-D in FIG. 9(*a*) before and after the SiGe film is formed. Silicon films 901 and 902 other than a channel region 900 are removed, and SiGe films 903 and 904 are epitaxially grown in the portion in which the silicon films 901 and 902 are removed.

In order to effectively apply a stress to the channel region 900, a carbon-containing silicon film 905 is also slightly removed at the time when the silicon films 901 and 902 are removed.

Figure 10:
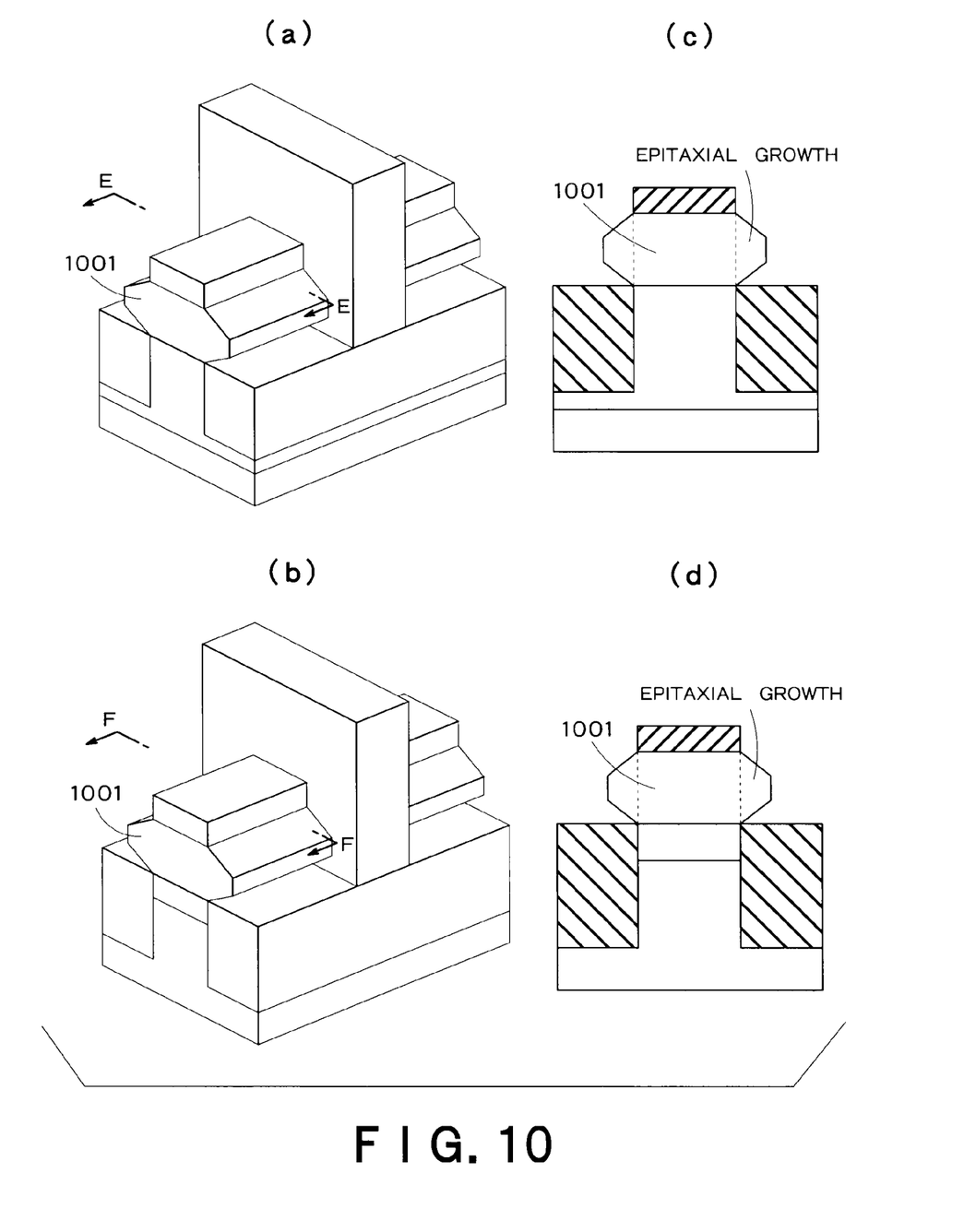

Further, as shown in FIG. 10, it may also be configured such that the source and drain resistance is reduced by epitaxially growing a silicon film 1001 in the source and drain regions of the fin. FIG. 10(a) and FIG. 10(b) are perspective views. FIG. 10(c) and FIG. 10(d) respectively show longitudinal sectional views taken along the line E-E in FIG. 10(a) and the line F-F in FIG. 10(b).

Figure 11:
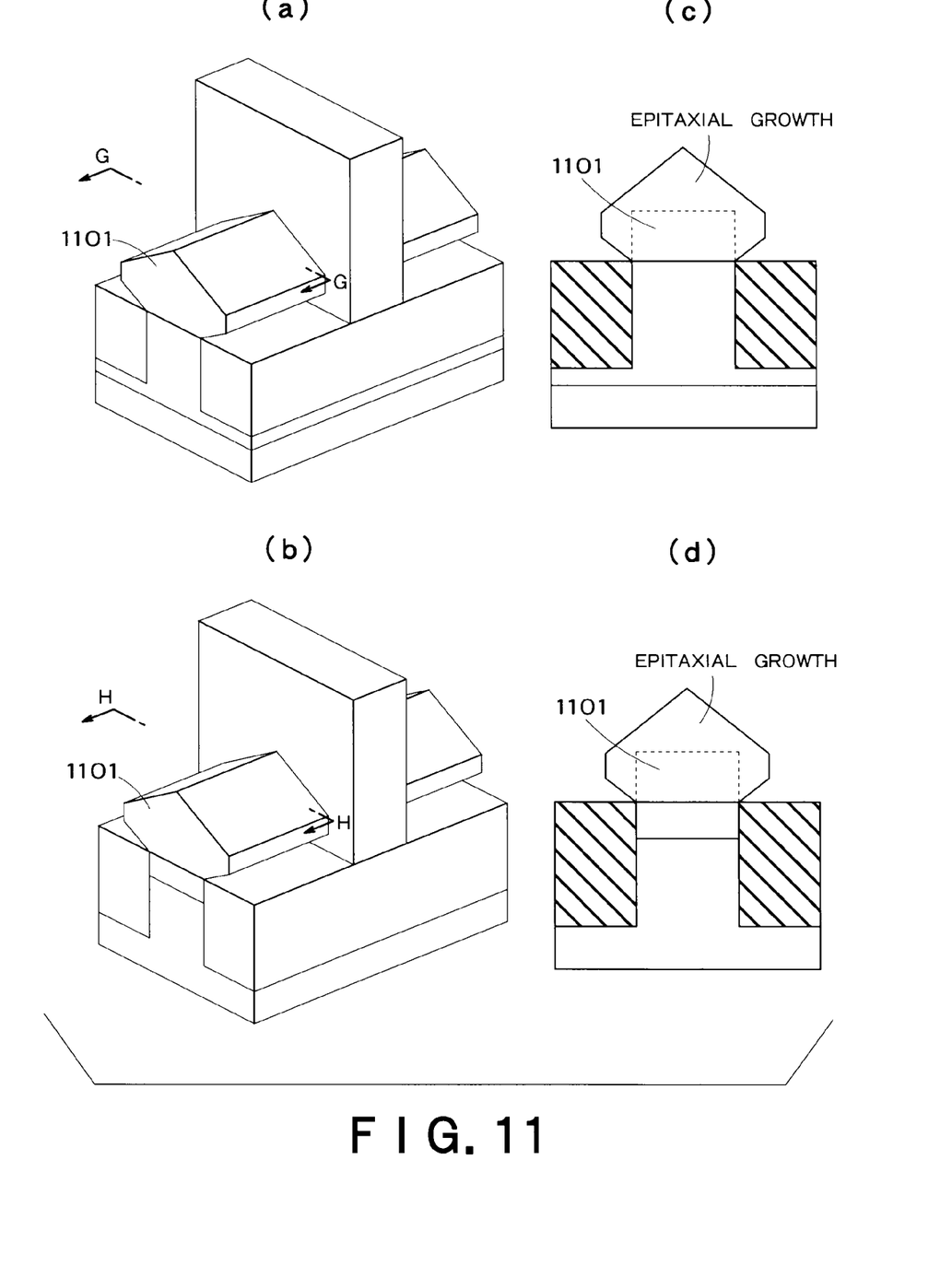

Further, as shown in FIG. 11, it may also be configured such that a silicon film 1101 is epitaxially grown in the source and drain regions after the insulating film (mask) on the fin is removed. FIG. 11(a) and FIG. 11(b) are perspective views. FIG. 11(c) and FIG. 11(d) respectively show longitudinal sectional views taken along the line G-G in FIG. 11(a) and the line H-H in FIG. 11(b).

In the above described embodiments, the gate insulating film is also formed on the source and drain regions by thermal oxidation of the fin surface. However, the gate insulating film formed on the source and drain regions is removed by a pretreatment at the time of epitaxially growing the silicon film in the source and drain regions as shown in FIG. 10 and FIG. 11.

In the above described embodiments, the gate insulating film is formed by thermal oxidation of the fin surface. However, the gate insulating film may also be formed by depositing an insulating film, such as a silicon oxide film, by using a CVD method or the like. The gate insulating film may not be a single-layer film, but may also be a multi-layer film, and a High-k film.

In the above described embodiments, boron is used as the impurity for forming the punch-through stopper, but indium (In) may also be used.

Furthermore, other impurities may be used for forming the punch-through stopper.

In the above described embodiments, the gate electrode is formed by the polysilicon film. However, a metal film (made of, for example, TaN, Ta, TiN, Ti, Co, or the like) may also be used as the gate electrode in order to adjust the threshold value and to reduce the gate resistance.

In the above described embodiments, the TEOS film is used as the element isolation insulating film. However, the other insulating film, such as a SiN film, may also be used as the element isolation insulating film, and the element isolation insulating film may also be configured by a multi-layer film. Further, the insulating film (mask) formed on the fin may be formed in a multi-layer insulating film structure.

In the above described embodiments, the gate electrode is also formed on the fin (channel region), but the gate electrode may be eliminated. Further, in the above described embodiments, a double gate structure is described. However, a triple gate (tri gate) structure may also be configured such that the gate insulating film is formed after the insulating film (mask) on the fin is removed, and that gate electrodes are formed on both side surfaces of the fin (channel region) in the short side direction and the upper surface of the fin via the gate insulating film.

Figure 12:
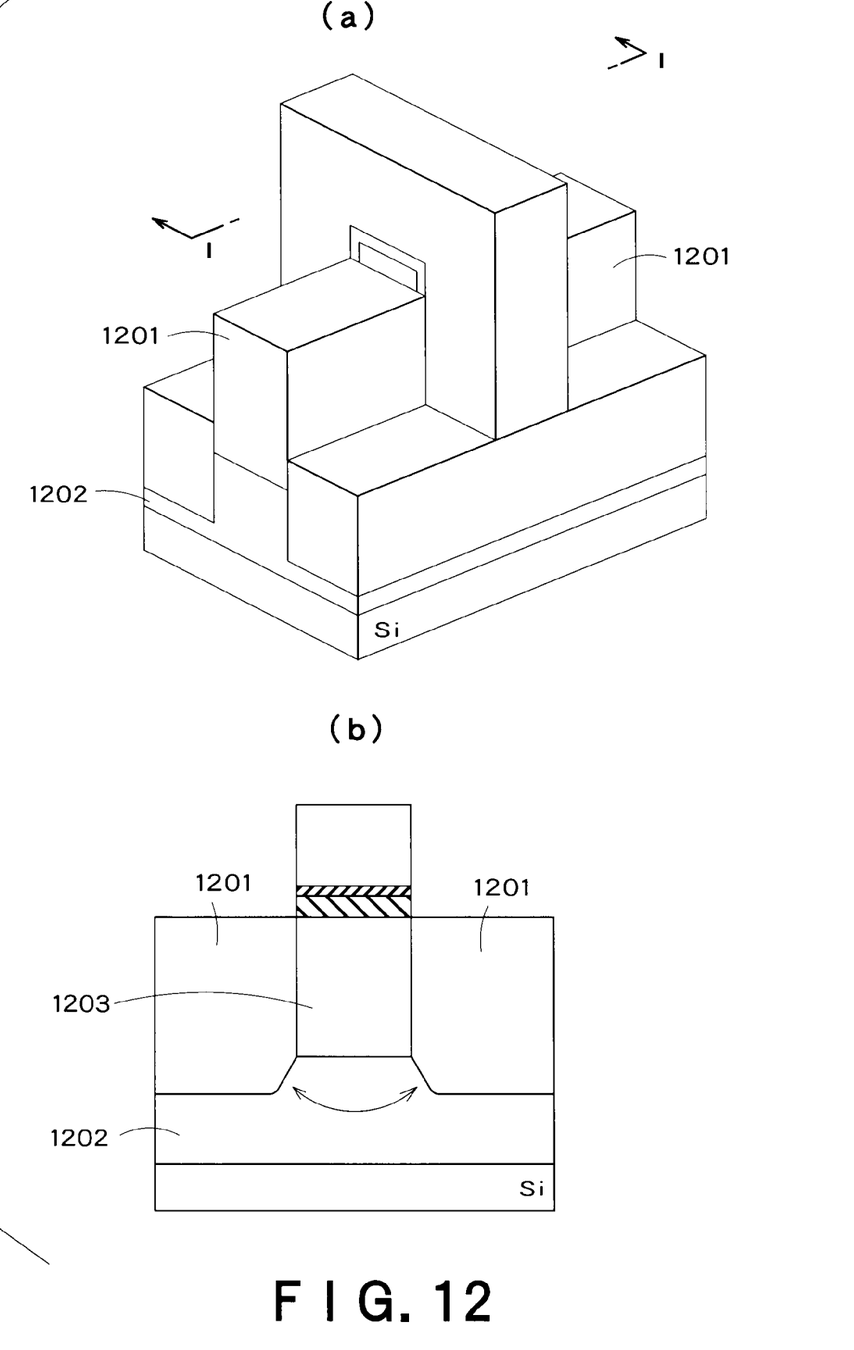

It is possible to reduce the occurrence of punch through in such a manner that the boron diffusion preventing effect of the carbon-containing silicon film as described above is used, and that the carbon-containing silicon film is provided under the channel region of a transistor having a P-type impurity diffusion layer. FIG. 12 shows a configuration example of such transistor. FIG. 12(a) is a perspective view. FIG. 12(b) is a longitudinal sectional view taken along the line I-I in FIG. 12(a). Boron is injected into a diffusion layer 1201.

Since a carbon-containing silicon film 1202 is formed under a channel region 1203, the diffusion of the impurity (boron) in the bottom portion of the channel region 1203 is suppressed. Therefore, the distance required to cause the punch through is increased, so that the punch through is effectively suppressed.

What is claimed is:

1. A semiconductor device comprising:
   a semiconductor substrate;
   a semiconductor fin which is formed on the semiconductor substrate, which has a long side direction and a short side direction, and which has a carbon-containing silicon film including an impurity and a first silicon film stacked on the carbon-containing silicon film;
   a gate electrode which is formed to face both side surfaces of the semiconductor fin in the short side direction;
   source and drain regions which are respectively formed in the semiconductor fin located in the direction of both sides in the long side direction of the semiconductor fin so as to sandwich the gate electrode; and
   an element isolation insulating film which is formed on the side surface of the semiconductor fin and between the gate electrode and the semiconductor substrate,
   wherein the first silicon film is not formed on side surfaces of the carbon-containing silicon film.

2. The semiconductor device according to claim 1, further comprising a second silicon film containing the impurity formed between the carbon-containing silicon film and the semiconductor substrate, and under the carbon-containing silicon film.

3. The semiconductor device according to claim 1, wherein in the carbon-containing silicon film, the impurity concentration in the boundary surface between the carbon-containing silicon film and the film provided on the carbon-containing silicon film is smaller than the impurity concentration in the boundary surface between the carbon-containing silicon film and the film provided under the carbon-containing silicon film.

4. The semiconductor device according to claim 1, wherein in the carbon-containing silicon film, the impurity concentration in the boundary surface between the carbon-containing silicon film and the film provided on the carbon-containing silicon film is smaller than the impurity concentration in regions in the carbon-containing silicon film other than the boundary surface.

5. The semiconductor device according to claim 1, wherein parts of the semiconductor fin corresponding to the source and drain regions are silicon germanium films, and the first silicon film is sandwiched by the silicon germanium films.

6. The semiconductor device according to claim 5, wherein the lower surface of the first silicon film is located at a position higher than the lower surface of the silicon germanium films.

7. The semiconductor device according to claim 1, wherein parts of the semiconductor fin corresponding to the source and drain regions are third silicon films, and the short side direction length of the third silicon films is longer than the short side direction length of the first silicon film facing the gate electrode.

8. The semiconductor device according to claim 7, wherein the upper surface of the third silicon films is located at a position higher than the upper surface of the first silicon film facing the gate electrode.

9. The semiconductor device according to claim 1, wherein the first silicon film contains germanium.

10. The semiconductor device according to claim 9, wherein the semiconductor fin further includes a second silicon film containing the impurity under the carbon-containing silicon film.

11. The semiconductor device according to claim 1, wherein in the carbon-containing silicon film, the impurity concentration in the boundary surface between the carbon-containing silicon film and the film provided on the carbon-containing silicon film is smaller than the impurity concentration in the boundary surface between the carbon-containing silicon film and the film provided under the carbon-containing silicon film.

12. The semiconductor device according to claim 1, wherein in the carbon-containing silicon film, the impurity concentration in the boundary surface between the carbon-containing silicon film and the film provided on the carbon-containing silicon film is smaller than the impurity concentration in regions in the carbon-containing silicon film other than the boundary surface.

13. A semiconductor device comprising:
a semiconductor substrate;
a semiconductor fin which is formed on the semiconductor substrate, which has a long side direction and a short side direction, and which has a carbon-containing silicon film including an impurity and a silicon film stacked on the carbon-containing silicon film;
a gate electrode which is formed to face both side surfaces of the semiconductor fin in the short side direction;
source and drain regions which are respectively formed in the semiconductor fin located in the direction of both sides in the long side direction of the semiconductor fin so as to sandwich the gate electrode; and
an element isolation insulating film which is formed on the side surface of the semiconductor fin and between the gate electrode and the semiconductor substrate,
wherein in the carbon-containing silicon film, the impurity concentration in the boundary surface between the carbon-containing silicon film and the film provided on the carbon-containing silicon film is smaller than the impurity concentration in the boundary surface between the carbon-containing silicon film and the film provided under the carbon-containing silicon film.

14. A semiconductor device comprising:
a semiconductor substrate;
a semiconductor fin which is formed on the semiconductor substrate, which has a long side direction and a short side direction, and which has a carbon-containing silicon film including an impurity and a silicon film stacked on the carbon-containing silicon film;
a gate electrode which is formed to face both side surfaces of the semiconductor fin in the short side direction;
source and drain regions which are respectively formed in the semiconductor fin located in the direction of both sides in the long side direction of the semiconductor fin so as to sandwich the gate electrode; and
an element isolation insulating film which is formed on the side surface of the semiconductor fin and between the gate electrode and the semiconductor substrate,
wherein in the carbon-containing silicon film, the impurity concentration in the boundary surface between the carbon-containing silicon film and the film provided on the carbon-containing silicon film is smaller than the impurity concentration in regions in the carbon-containing silicon film other than the boundary surface.

15. A semiconductor device comprising:
a semiconductor substrate;
a semiconductor fin which is formed on the semiconductor substrate, which has a long side direction and a short side direction, and which has a carbon-containing silicon film including an impurity and a silicon film stacked on the carbon-containing silicon film;
a gate electrode which is formed to face both side surfaces of the semiconductor fin in the short side direction;
source and drain regions which are respectively formed in the semiconductor fin located in the direction of both sides in the long side direction of the semiconductor fin so as to sandwich the gate electrode; and
an element isolation insulating film which is formed on the side surface of the semiconductor fin and between the gate electrode and the semiconductor substrate,
wherein parts of the semiconductor fin corresponding to the source and drain regions are silicon germanium films, and the first silicon film is sandwiched by the silicon germanium films.

16. The semiconductor device according to claim 15, wherein the lower surface of the silicon film is located at a position higher than the lower surface of the silicon germanium films.

* * * * *